US007928888B1

(12) United States Patent
Chiu et al.

(10) Patent No.: US 7,928,888 B1
(45) Date of Patent: Apr. 19, 2011

(54) PIPELINE TIME-TO-DIGITAL CONVERTER

(75) Inventors: Huan-Ke Chiu, Hsinchu County (TW); Horng-Yuan Shih, Taipei (TW); Chiou-Bang Chen, Hsinchu County (TW); Tzu-Chan Chueh, Taipei County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 12/639,003

(22) Filed: Dec. 16, 2009

(30) Foreign Application Priority Data

Oct. 9, 2009 (TW) .................................. 98134319

(51) Int. Cl.
*H03M 1/38* (2006.01)

(52) U.S. Cl. ........................................ 341/161; 331/1 A

(58) Field of Classification Search .......... 341/122–169; 340/507; 331/1 A; 368/113, 118, 120; 327/158, 327/160, 161, 233, 235, 261, 263, 265
See application file for complete search history.

(56) References Cited

U.S. PATENT DOCUMENTS

| | | | | |
|---|---|---|---|---|
| 4,439,046 | A | 3/1984 | Hoppe | |
| 6,501,706 | B1 * | 12/2002 | West | 368/118 |
| 6,751,613 | B1 * | 6/2004 | Lee et al. | 1/1 |
| 6,754,613 | B2 | 6/2004 | Tabatabaei et al. | |
| 6,868,047 | B2 * | 3/2005 | Sartschev et al. | 368/118 |
| 7,205,924 | B2 | 4/2007 | Vemulapalli et al. | |
| 7,564,284 | B2 * | 7/2009 | Henzler et al. | 327/261 |
| 7,688,126 | B2 * | 3/2010 | Henzler et al. | 327/261 |
| 2008/0069292 | A1 | 3/2008 | Straayer et al. | |
| 2008/0129574 | A1 * | 6/2008 | Choi et al. | 341/166 |
| 2010/0283653 | A1 * | 11/2010 | Dai et al. | 341/166 |

OTHER PUBLICATIONS

Article Titled "A 9 b, 1.25 ps Resolution Coarse-Fine Time-to-Digital Converter in 90 nm CMOS that Amplifies a Time Residue", jointly authored by Minjae Lee, et al. in IEEE JSSCC, vol. 43, No. 4, pp. 769-777, Apr. 2008.
Article Titled "A 3 GHz Fractional All-Digital PLL With a 1.8 MHz Bandwidth Implementing Spur Reduction Techiques", jointly authored by Enrico Temporiti, et al.,in IEEE JSSCC, vol. 44, No. 3, pp. 824-834, Mar. 2009.
Article Titled "A Wide-Range, High-Resolution, Compact, CMOS Time to Digital Converter", jointly authored by V. Ramakrishnan, et al., in IEEE Proceedings of the 19th International Conference on VLSI Design (VLSID'06), 2006.

* cited by examiner

*Primary Examiner* — Lam T Mai
(74) *Attorney, Agent, or Firm* — Jianq Chyun IP Office

(57) ABSTRACT

A pipeline time-to-digital converter (TDC) is provided. The pipeline TDC includes a plurality of TDC cells. Each of the TDC cells includes a delay unit, an output unit and a determination unit. The delay unit receives a first clock signal and a first reference signal output from a previous stage TDC cell. The delay unit generates sampling phases in a period between a trigger edge of the first reference signal and a trigger edge of the first clock signal, and samples the first clock signal to obtain sampling values in accordance with the sampling phases. The output unit calculates the sampling values for outputting a conversion value. The determination unit uses and analyses the sampling values and the sampling phases for outputting time residue to a next stage TDC cell.

15 Claims, 12 Drawing Sheets

PIPELINE TIME-TO-DIGITAL CONVERTER

CROSS-REFERENCE TO RELATED APPLICATION

This application claims the priority benefit of Taiwan application serial no. 98134319, filed Oct. 9, 2009. The entirety of the above-mentioned patent application is hereby incorporated by reference herein and made a part of specification.

BACKGROUND

1. Technical Field

The present disclosure relates to a time-to-digital converter (TDC). More particularly, the present disclosure relates to a pipeline TDC.

2. Description of Related Art

A time-to-digital converter (TDC) is one of important techniques in development of integrated circuits, and the TDC is widely used in communication chips, biomedical chips and measurement chips. For example, in a digital phase-locked loop (DPLL) of the communication chip, a TDC with a high resolution is used to reduce in-band phase noise of the loop. If the phase noise is required to be less than 100 dB c/Hz, the resolution is required to be 6 ps. However, design of a high resolution TDC is a great challenge.

Design of the high resolution TDC mainly faces three main problems: (1) whether a resolution of an advanced process circuit is high enough; (2) whether a dynamic-range of circuit operation can be increased; (3) whether it can be avoided to use a complex approach or a super high-speed clock to process data. Therefore, the above three problems has to be balanced to meet a system application and power requirements. Regarding the resolution, it is one of important standards of the DPLL.

In a U.S. Pat. No. 7,205,924, a Vernier TDC is used, and delay buffers are added to two paths of a high-speed clock (2 GHz) and a reference clock (26 MHz). A resolution of such structure is limited by the delay buffers, and highly relates to a semiconductor process, which can only provide a resolution of 20 ps in a CMOS 90 nm process.

According to an article "A 9 b, 1.25 ps resolution coarse-fine time-to-digital converter in 90 nm CMOS that amplifies a time residue" (*IEEE JSSCC*, vol. 43, no. 4, pp. 769-777, April 2008) authored by Minjal Lee and Asad A. Abidi et al., when the resolution is not enough, a time residue is first amplified by a calibrated time amplifier (TA), and then a further analysing is performed, so that the resolution can reach 1.25 ps. Such structure requires a rather complex calibration circuit to calibrate the time amplifier, and a main problem thereof is that an accurate time amplification gain of time cannot be obtained according to a feedback approach as that does of a voltage, so that a non-ideal effect of the time amplifier is an intractable problem.

If a gated ring oscillator (GRO) is used to improve the resolution, such as TDCs disclosed in a U.S. Pat. No. 6,754,613 and a U.S. Patent Application No. 2008/0069292 A1, etc., the problem of the time amplifier is unnecessary to be handled. However, such structure requires rather high oscillation frequency and consumes rather great power (about 10 times) to obtain a relatively high resolution (for example, 1 ps).

Moreover, according to an article "A 3 GHz fractional all-digital PLL with a 1.8 MHz bandwidth implementing spur reduction techniques" (*IEEE JSSCC*, vol. 44, no. 3, pp. 824-834, March 2009) authored by E. Temporiti, C. Weltin-Wu, D. Baldi, R. Tonietto, and F. Svelto et al., a calibrated delay circuit is used to generate a little difference between a plurality of high-speed clocks, so as to increase the resolution. For example, the calibrated delay circuit can sample one more times in one of every 5 high-speed clock semi-periods, and the resolution thereof can be 7.9 ps. However, a shortage of such structure is that if the dynamic-range of the circuit operation is increased, i.e. a frequency of the high-speed clock is decreased, a plurality of the high-speed clocks cannot be used to generate the difference, so that the resolution is decreased.

SUMMARY

Consistent with the embodiment, there is provided a pipeline time-to-digital converter (TDC), which is a high resolution TDC designed based on a simple, flexible and effective circuit design structure. According to a pipeline processing, a resolution and a dynamic-range can be both considered, and processing of an accurate time amplification gain required by a time amplifier is unnecessary, so that design and usage of the pipeline TDC can be more efficiency.

Consistent with the embodiment, there is provided a pipeline TDC having a plurality of TDC cells connected in series. Each of the TDC cells includes a delay unit, an output unit and a determination unit. The delay unit receives a first clock signal and a first reference signal output from a previous stage TDC cell. The delay unit generates a plurality of sampling phases in a period between a trigger edge of the first reference signal and a trigger edge of the first clock signal, and samples the first clock signal to obtain a plurality of sampling values according to the sampling phases. The output unit is coupled to the delay unit for receiving the sampling values, and calculates the sampling values to output a conversion value. The determination unit is coupled to the delay unit for receiving the sampling values and the sampling phases. The determination unit selects a sampling phase corresponding to the trigger edge of the first clock signal from the sampling phases to serve as a second reference signal, generates a pulse according to the trigger edge of the first clock signal to serve as a second clock signal, and outputs the second reference signal and the second clock signal to a next stage TDC cell.

According to the above description, the whole structure of the pipeline TDC can be divided into a plurality of sub structures (TDC cells). Each of the sub structures is in charge of the resolution of a few bits, so that a user can flexibly determine the resolution of the pipeline TDC according to a number of the sub structures connected in series.

In order to make the aforementioned and other features and advantages of the present disclosure comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
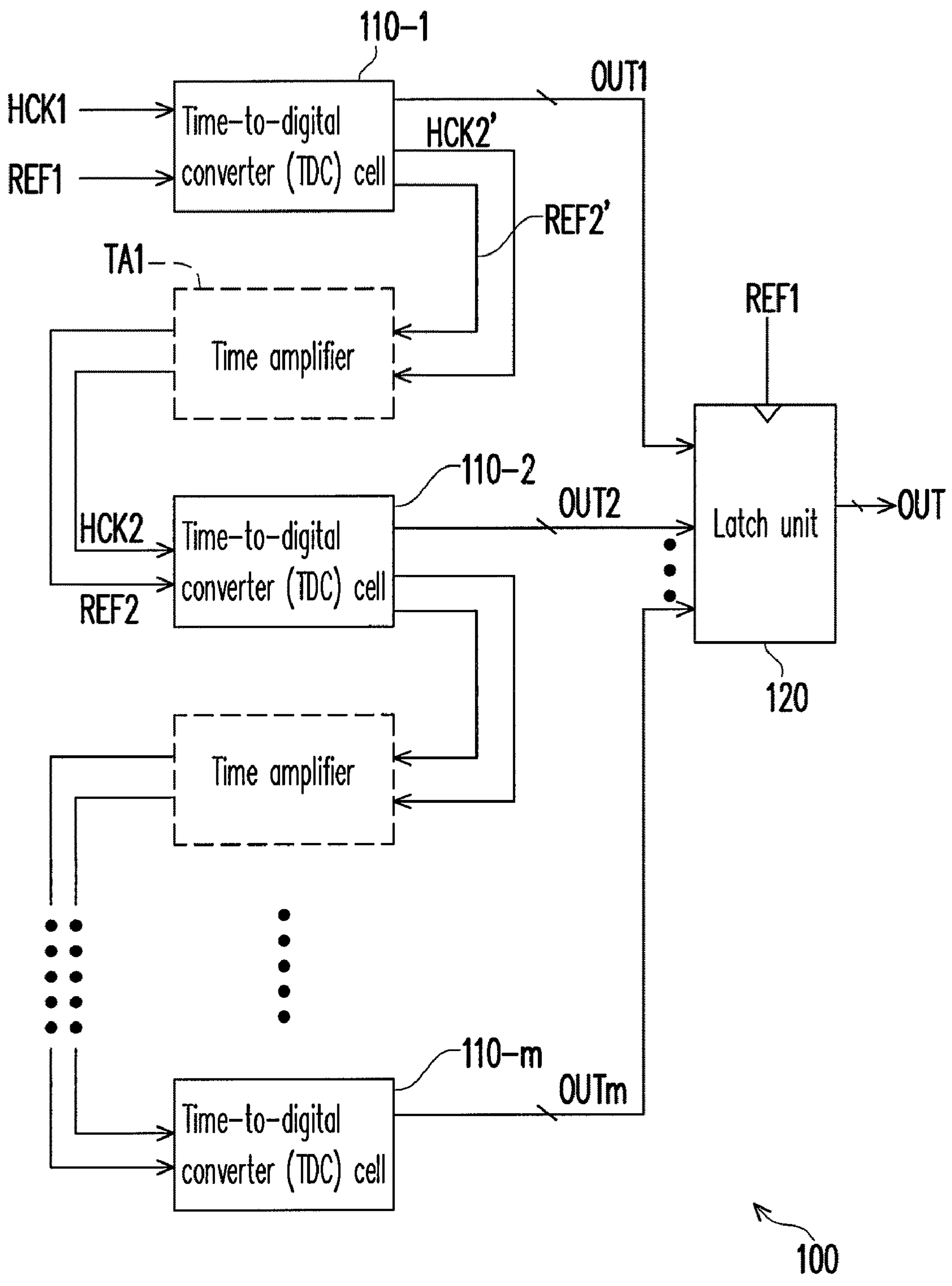
FIG. 1 is a block schematic diagram illustrating a pipeline time-to-digital converter (TDC) according to an embodiment of the present disclosure.

FIG. 1 is a block schematic diagram illustrating a pipeline time-to-digital converter (TDC) according to an embodiment of the present disclosure. Referring to FIG. 1, the pipeline TDC 100 is divided into a plurality of sub structures (i.e. a plurality of TDC cells 110-1, 110-2, . . . , 110-*m*). Each of the sub structures is similar to a Vernier TDC. The TDC cells 110-1~110-*m* are connected in series to form a pipeline structure. The TDC cells 110-1~110-*m* respectively have a calibration circuit for performing time delay adjustment and linearity adjustment to delay buffers. Since a magnitude of the calibration circuit of the Vernier TDC is proportional to the square of a number of the delay buffers, dividing the pipeline TDC can reduce a great amount of the calibration circuit. For example, assuming frequencies of a high-speed clock (i.e. HCK1) and a reference clock (i.e. REF1) are respectively 400 MHz and 40 MHz, regarding a TDC of 1 sub structure and a pipeline TDC of 3 sub structures connected in series, numbers of the delay buffers thereof are respectively 336 and 3×40, and a magnitude of the calibration circuit of the latter one is only about 1/23 of that of the former one.

A time amplifier can be selectively configured between two adjacent TDC cells. For example, a time amplifier TA1 is coupled between the TDC cells 110-1 and 110-2. The time amplifier TA1 can amplify time characteristics of a clock signal HCK2' and a reference signal REF2' output by the TDC cell 110-1. For example, the time amplifier TA1 can amplify a pulse width of the clock signal HCK2' and amplify a time distance between the clock signal HCK2' and the reference signal REF2'. After the time amplifier TA1 amplifies the time characteristics of the clock signal HCK2' and the reference signal REF2', the time amplifier TA1 outputs a clock signal HCK2 and a reference signal REF2 to a next stage TDC cell 110-2. A user can implement the time amplifier by any approach according to actual design requirements. For example, a time amplifier disclosed in an article "A 9 b, 1.25 ps resolution coarse-fine time-to-digital converter in 90 nm CMOS that amplifies a time residue" (*IEEE JSSCC*, vol. 43, no. 4, pp. 769-777, April 2008) can be used as the time amplifier shown in FIG. 1.

In some embodiments, if a smallest delay time of the delay unit in the TDC cell 110-2 is small enough, i.e. the delay unit of the TDC cell 110-2 can process the clock signal HCK2' and the reference signal REF2' output by the TDC cell 110-1, the time amplifier TA1 can be omitted according to the design requirement.

Each of the TDC cells 110-1110-*m* is only in charge of resolution of a few bits. For example, the TDC cell 110-1 converts a phase difference between the clock signal HCK1 and the reference signal REF1 into a first conversion value OUT1, and transmits time residue that cannot be analysed to the next stage TDC cell 110-2. The TDC cell 110-2 performs the same conversion operation to the time residue output by the TDC cell 110-1, i.e. converts a phase difference between the clock signal HCK2' and the reference signal REF2' into a second conversion value OUT2. Operations of the other TDC cells can be deduced by analogy. Therefore, the first stage TDC cell 110-1 can provide a coarse conversion value, and the second stage TDC cell 110-2 can provide a fine conversion value. The user can adjust the number of the TDC cells connected in series to flexibly determine the resolution. A latch unit 120 coupled to the TDC cells 110-1~110-*m* can latch the conversion values OUT1, OUT2, . . . , OUTm, so as to output a digital code OUT.

Figure 2:
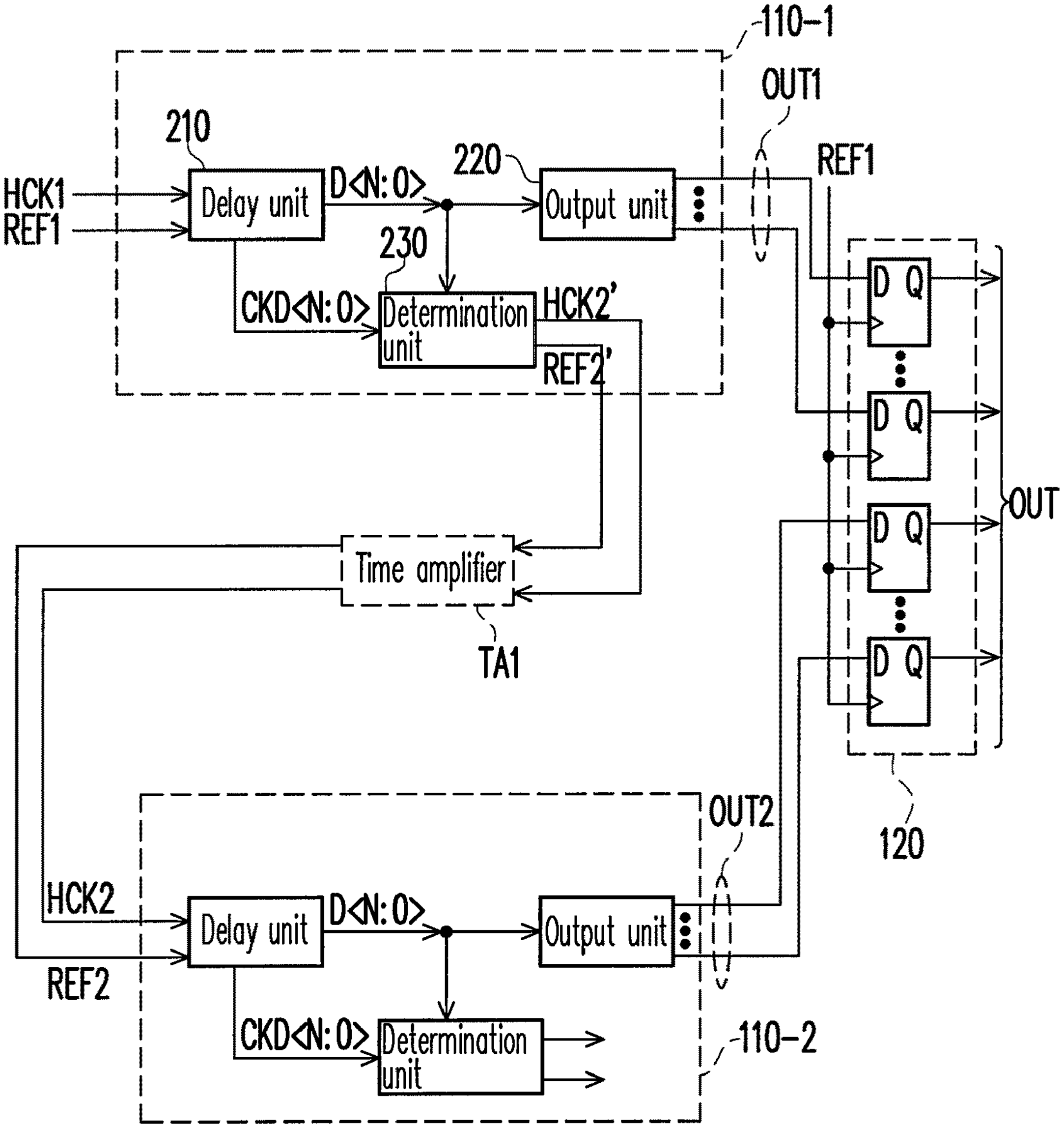
FIG. 2 is a block schematic diagram illustrating a TDC cell 110-1 of FIG. 1 according to an embodiment of the present disclosure.

Implementations of the TDC cells 110-1~110-*m* can be the same or similar. The TDC cell 110-1 is taken as an example for description. FIG. 2 is a block schematic diagram illustrating the TDC cell 110-1 of FIG. 1 according to an embodiment of the present disclosure. In the present embodiment, m is assumed to be 2, i.e. the pipeline TDC 100 has two stages of the pipeline structure. The TDC cell 110-1 includes a delay unit 210, an output unit 220 and a determination unit 230. The delay unit 210 receives a first clock signal and a first reference signal from a previous stage TDC cell. In the present embodiment, since the TDC cell 110-1 is a first stage TDC cell in the pipeline structure, the delay unit 210 receives the first clock signal HCK1 and the first reference signal REF1 provided by an external device (not shown) of the pipeline TDC 100.

Figure 3:
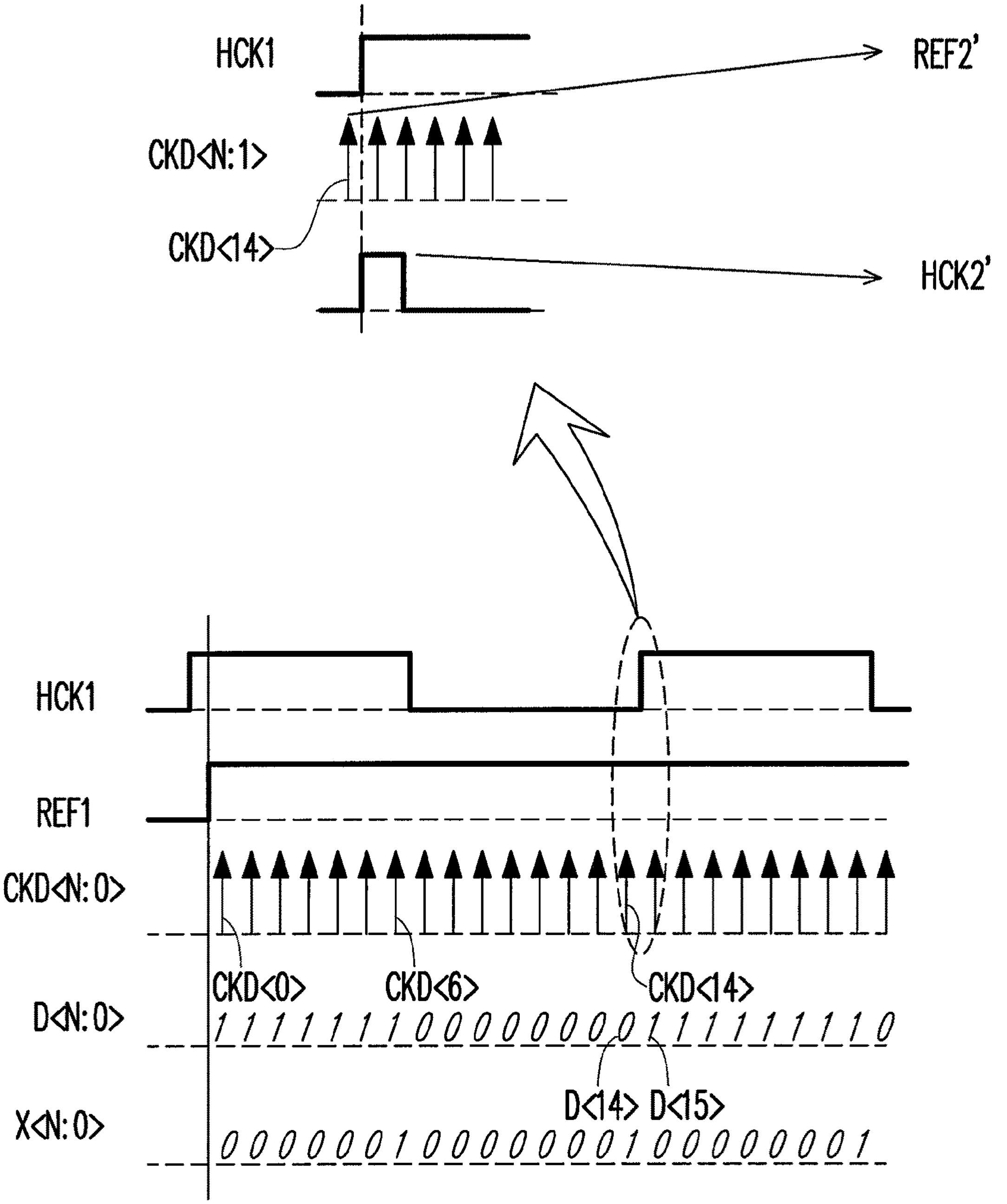
FIG. 3 is a timing diagram of signals of FIG. 1.

FIG. 3 is a timing diagram of signals of FIG. 1. Assuming each of the TDC cells is in charge of the resolution of 4 bits, the delay time of the delay unit 210 has to be adjusted, so that each semi-period of the first clock signal HCK1 has 8 samplings.

Referring to FIG. 2 and FIG. 3, the delay unit 210 generates a plurality of sampling phases CKD<N:0> during a period between a trigger edge (for example, a rising edge) of the first reference signal REF1 and a trigger edge (for example, a rising edge) of the first clock signal HCK1, and samples the first clock signal HCK1 according to the sampling phases CKD<N:0>, so as to obtain N+1 sampling values D<N:0>. The delay unit 210 can be implemented by any approach according to an actual design requirement. For example, a ring oscillator disclosed by a U.S. Patent Open No. 2008/0069292 can be applied to serve as the delay unit 210 of FIG. 2. Moreover, a number (i.e. N) of the sampling phases CKD<N:0> is also determined according to the actual design requirement. For example, the number of the sampling phases in the semi-period of the first clock signal HCK1 is 8, and the sampling phases CKD<N:0> has 19 sampling phases (i.e. N=18), namely, 3 samplings are additionally kept for the first clock signal HCK1 to avoid occurrence of unrecognised samplings during calibration.

The output unit 220 is coupled to the delay unit 210 for receiving the sampling values D<N:0> and calculating the sampling values D<N:0> to output a conversion value. According to FIG. 3, a fifteenth bit in D<N:0> (i.e. D<14>) is logic 0, and a sixteenth bit (i.e. D<15>) is logic 1, so that the trigger edge of the first clock signal HCK1 is appeared between the fifteenth sampling phase (i.e. CKD<14>) and the sixteenth sampling phase (i.e. CKD<15>). Therefore, the output unit 220 can obtain that a time distance between two trigger edges of the first reference signal REF 1 and the first clock signal HCK1 is 15 sampling phases (i.e. CKD<0>~CKD<14>) by calculating the sampling values D<N:0>, so as to output the corresponding conversion value OUT1 (for example, a binary value "1111") to the latch unit 120. The conversion value OUT1 can serve as a most significant bit (MSB) of the digital code OUT.

The determination unit 230 is coupled to the delay unit 210 for receiving the sampling values D<N:0> and the sampling phases CKD<N:0>. The determination unit 230 transmits the time residue that cannot be analysed by the output unit 220 to the next stage TDC cell 110-2. In detail, the determination unit 230 selects a sampling phase corresponding to the trigger edge of the first clock signal HCK1 from the sampling phases CKD<N:0> to serve as a second reference signal REF2'. According to FIG. 3, the determination unit 230 selects a fifteenth sampling phase CKD<14>, and outputs the sampling phase CKD<14> to the TDC cell 110-2. Moreover, the determination unit 230 generates a pulse according to the trigger edge of the first clock signal HCK1 to serve as a second clock signal HCK2', wherein a width of such pulse can be determined according to an actual design requirement. For example, the width of the pulse can be approximately greater than a time distance between two adjacent sampling phases in the sampling phases CKD<N:0>. According to FIG. 3, it is obvious that a time distance (i.e. a phase difference) between the trigger edges of the second reference signal REF2' and the second clock signal HCK2' is the time residue that cannot be analysed by the output unit 220. Therefore, the determination unit 230 outputs the second reference signal REF2' and the second clock signal HCK2' to the next stage TDC cell 110-2.

Implementation of the TDC cell 110-2 is similar to that of the TDC cell 110-1. The delay unit and the output unit of the TDC cell 110-2 repeat the aforementioned operation processes to further perform the TDC processing to the time residue output by the TDC cell 110-1, so as to provide a fine (high resolution) conversion value OUT2. Such conversion value OUT2 can serve as a least significant bit (LSB) of the digital code OUT.

The latch unit 120 has a plurality of latches (or flip-flops). Trigger terminals of the latches receive the first reference signal REF 1 provided by the external device of the pipeline TDC 100. Input terminals of a part of the latches are coupled to the output unit 220 of the TDC cell 110-1, and input terminals of another part of the latches are coupled to the output unit of the TDC cell 110-2. According to a trigger timing of the first reference signal REF1, the latch unit 120 can latch the conversion values OUT1 and OUT2 to output the digital code OUT.

Figure 4:
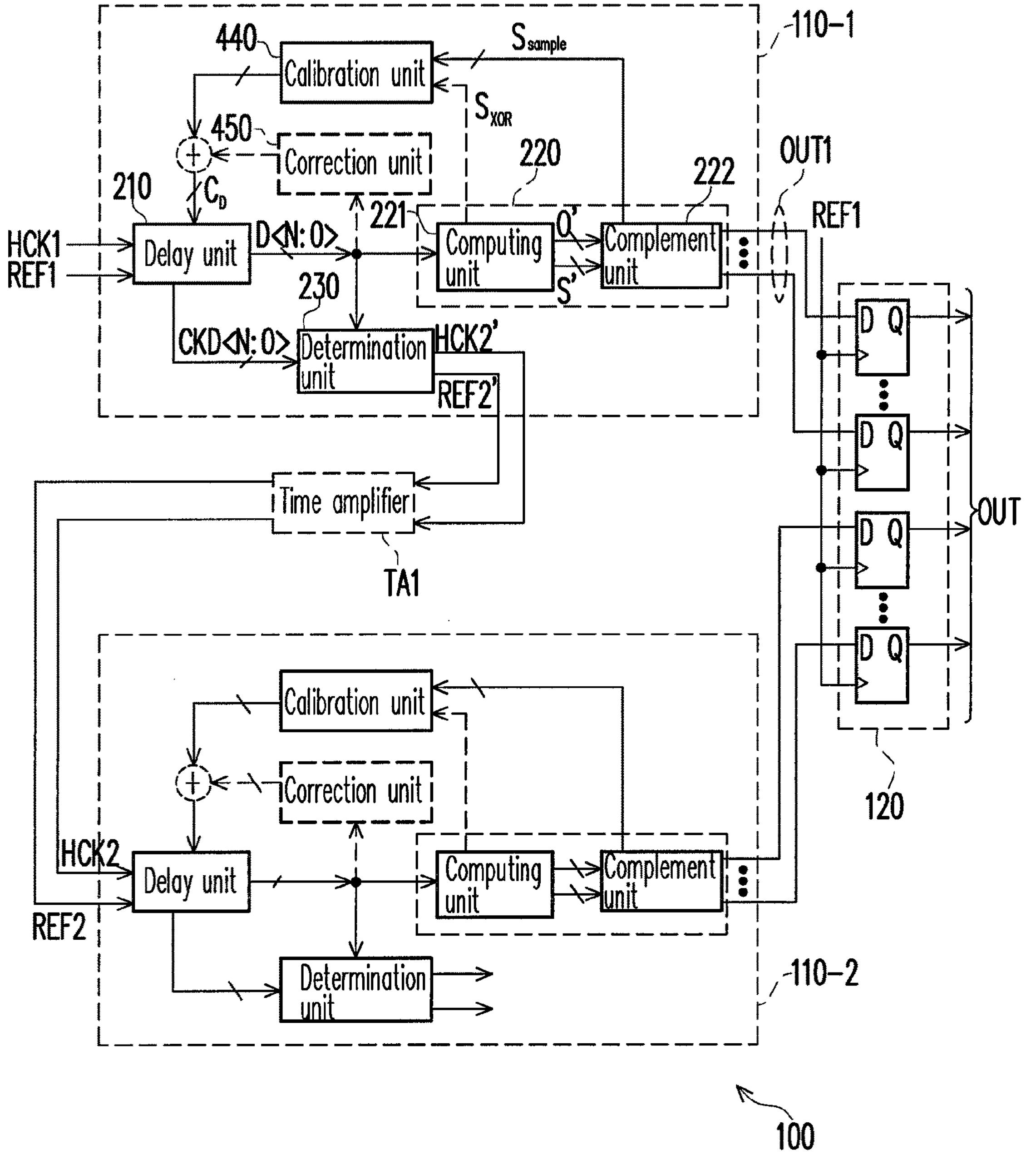
FIG. 4 is a block schematic diagram illustrating a TDC cell 110-1 of FIG. 1 according to another embodiment of the present disclosure.

Implementation of the TDC cell can be modified according to actual design requirements. For example, FIG. 4 is a block schematic diagram illustrating the TDC cell 110-1 of FIG. 1 according to another embodiment of the present disclosure. Implementations of the TDC cells 110-1 and 110-2 can be the same or similar. The TDC cell 110-1 is taken as an example for description. Implementation and operation process of the pipeline TDC 100 of FIG. 4 are partially the same to that of the pipeline TDC 100 of FIG. 2, so that detailed descriptions thereof are not repeated. Compared to the embodiment of FIG. 2, the TDC cell 110-1 of FIG. 4 further includes a calibration unit 440.

Referring to FIG. 3 and FIG. 4, besides outputting the conversion value OUT1 to the latch unit 120, the output unit 220 further outputs a sampling summation $S_{sample}$ to the calibration unit 440. The output unit 220 sums the sampling values D<N:0> and outputs the sampling summation $S_{sample}$. The calibration unit 440 is coupled to the output unit 220 and the delay unit 210. The calibration unit 440 compares the sampling summation $S_{sample}$ to a reference value, and provides a control signal $C_D$ to the delay unit 210 according to a comparison result, so as to adjust the time distance of the sampling phases CKD<N:0>.

Assuming the semi-period of the first clock signal HCK1 has 8 sampling phases according to the design requirement, the output unit 220 can sum 19 sampling values D<0>~D<18> (i.e. D<18:0>). According to FIG. 3, the sampling summation $S_{sample}$ obtained by summing the sampling values D<0>~D<18> is 8. If the reference value is set to 8, after the calibration unit 440 compares the sampling summation $S_{sample}$ to such reference value, it is known that the semi-period of the first clock signal HCK1 opportunely has 8 sampling phases, which matches a system specification, so that the calibration unit 440 keeps a current delay time of the delay unit 210 through the control signal $C_D$, i.e. keeps a current time distance of the sampling phases CKD<N:0>. If the sampling summation $S_{sample}$ is less than the reference value, it represents that a number of the sampling phases in the semi-period of the first clock signal HCK1 is less than 8, so that the calibration unit 440 decreases the time distance of the sampling phases CKD<N:0> through the control signal $C_D$. If the sampling summation $S_{sample}$ is greater than the reference value, it represents that the number of the sampling phases in the semi-period of the first clock signal HCK1 is greater than 8, so that the calibration unit 440 increases the time distance of the sampling phases CKD<N:0> through the control signal $C_D$. By such means, the calibration unit 440 can effectively calibrate the delay time of the delay unit 210.

A correction unit 450 can be selectively configured in the TDC cell 110-1 according to the design requirement, as that shown in FIG. 4. The correction unit 450 can adjust the control signal $C_D$ output by the calibration unit 440 to perform a non-linear correction to the delay unit 210. The calibration unit 440 and the correction unit 450 can be implemented by any approaches according to the design requirement. For example, a calibration loop and a correction loop disclosed by "A 3 GHz Fractional All-Digital PLL With a 1.8 MHz Bandwidth Implementing Spur Reduction Techniques" (*IEEE JSSCC*, vol. 44, no. 3, pp. 824-834, March 2009) can be used as the calibration unit 440 and the correction unit 450 of FIG. 4.

Figure 5A:
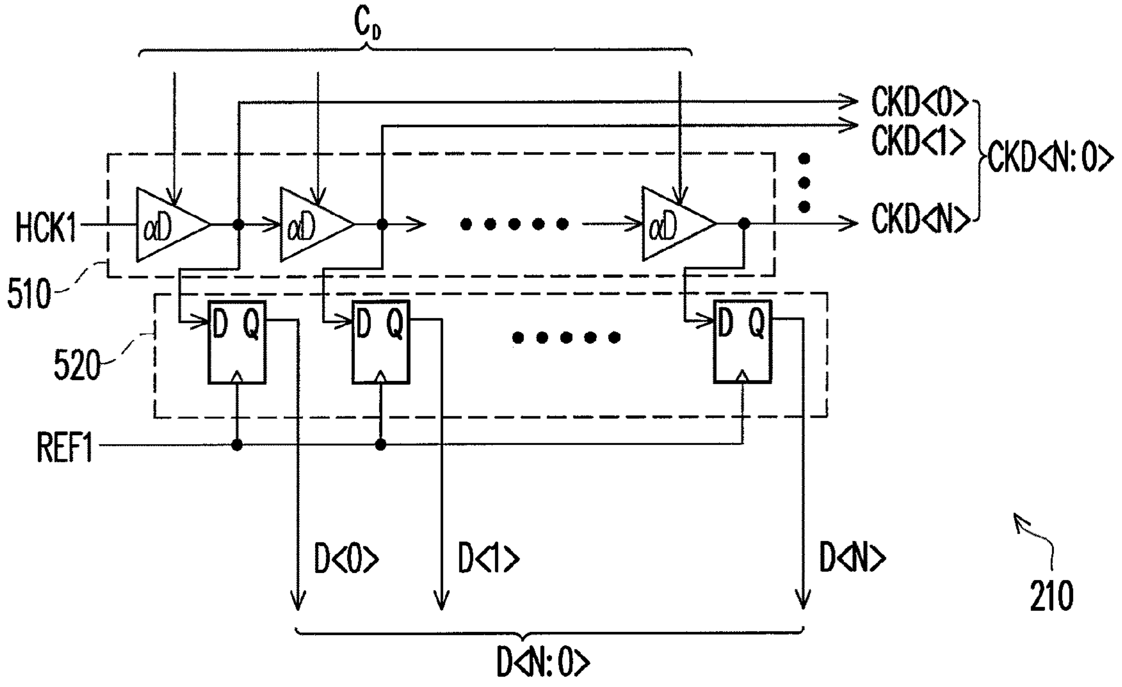
FIGS. 5A-5C are circuit diagrams illustrating a delay unit of FIG. 1 according to an embodiment of the present disclosure.
Figure 5B:
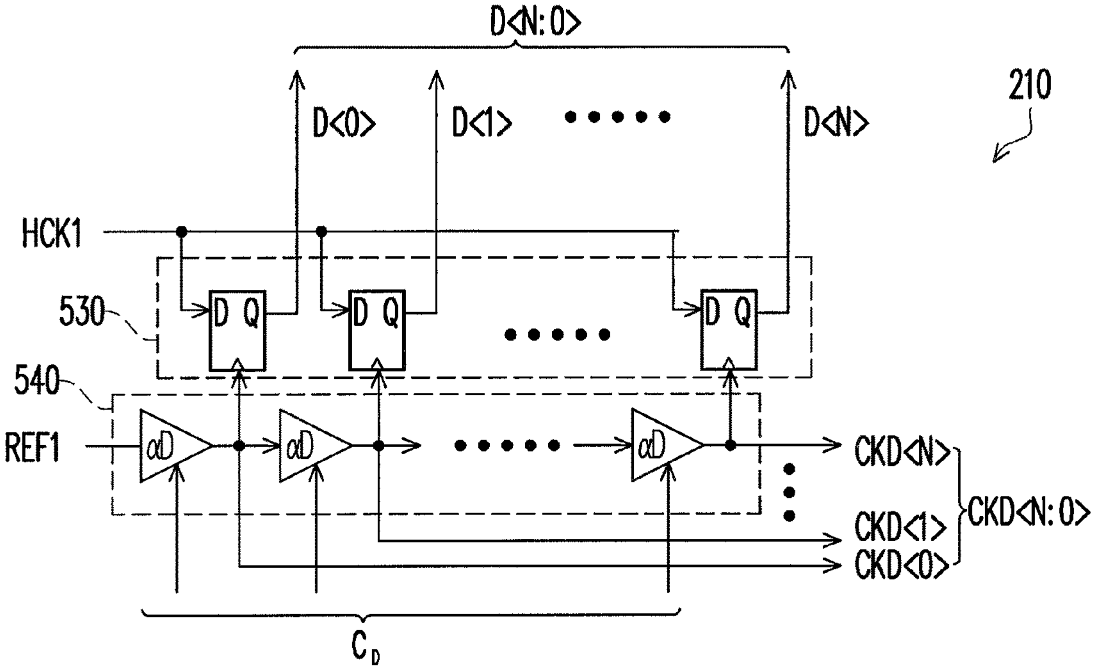
Figure 5C:
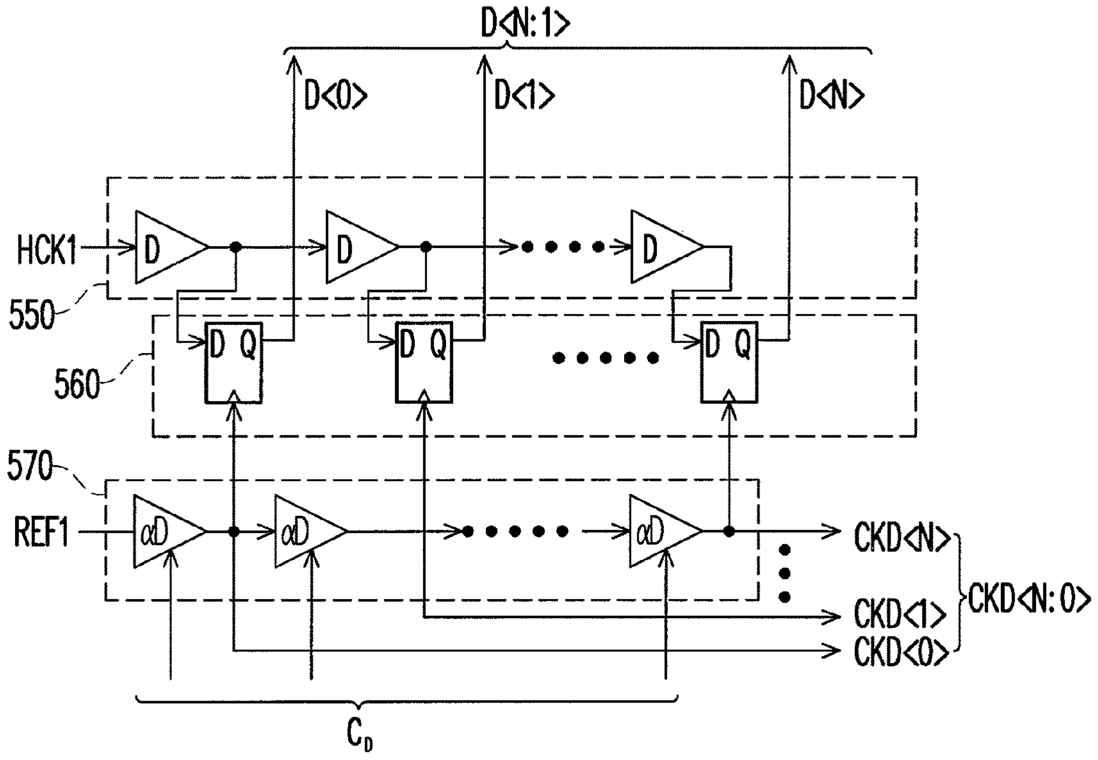

FIGS. 5A-5C are circuit diagrams illustrating the delay unit of FIG. 1 according to an embodiment of the present disclosure. Referring to FIG. 5A, the delay unit 210 includes N+1 controllable delay elements 510 and N+1 samplers 520. The controllable delay elements 510 are connected in series, and an input terminal of a first controllable delay element receives the first clock signal HCK1. Output terminals of the controllable delay elements 510 provide the sampling phases CKD<N:0>. Each of the controllable delay elements 510 can determine its own delay time $\alpha D$ according to the control signal $C_D$ output by the calibration unit 440. Trigger terminals of the samplers 520 receive the first reference signal REF1, and input terminals of the samplers 520 are one-by-one coupled to the output terminals of the controllable delay elements 510. Output terminals of the samplers 520 provide the sampling values D<N:0>. The samplers 520 can be flip-flops, latches, arbiters or other sampling circuits.

FIG. 5B is a diagram illustrating another implementation of the delay unit 210. The delay unit 210 includes N+1 samplers 530 and N+1 controllable delay elements 540. The controllable delay elements 540 are connected in series, and an input terminal of a first controllable delay element receives the first reference signal REF1. Output terminals of the controllable delay elements 540 provide the sampling phases CKD<N:0>. Each of the controllable delay elements 540 can determine its own delay time αD according to the control signal $C_D$ output by the calibration unit 440. Therefore, the calibration unit 440 can adjust the time distance of the sampling phases CKD<N:0> through the control signal $C_D$. Trigger terminals of the samplers 530 are one-by-one coupled to the output terminals of the controllable delay elements 540. Input terminals of the samplers 530 receive the first clock signal HCK1, and output terminals of the samplers 530 provide the sampling values D<N:0>. The samplers 530 can be flip-flops, latches, arbiters or other sampling circuits.

FIG. 5C is a diagram illustrating still another implementation of the delay unit 210. The delay unit 210 includes N+1 delay buffers 550, N+1 samplers 560 and N+1 controllable delay elements 570. The delay buffers 550 are connected in series, and an input terminal of a first delay buffer receives the first clock signal HCK1. Each stage delay in the delay buffers 550 delays an input signal thereof for time D, and transmits the delayed signal to a next stage delay through an output terminal thereof. The controllable delay elements 570 are also connected in series, and an input terminal of a first controllable delay element receives the first reference signal REF 1. Output terminals of the controllable delay elements 570 provide the sampling phases CKD<N:0>. Each of the controllable delay elements 570 can determine its own delay time αD according to the control signal $C_D$ output by the calibration unit 440, so as to adjust the time distance of the sampling phases CKD<N:0>. Trigger terminals of the samplers 560 are one-by-one coupled to the output terminals of the controllable delay elements 570, and input terminals of the samplers 560 are one-by-one coupled to the output terminals of the delay buffers 550. Output terminals of the samplers 560 provide the sampling values D<N:0>. The samplers 560 can be flip-flops, latches, arbiters or other sampling circuits.

FIG. 4 illustrates an embodiment of the output unit 220. In such embodiment, the output unit 220 includes a computing unit 221 and a complement unit 222. The computing unit 221 is coupled to the delay unit 210 for receiving the sampling values D<N:0>. The computing unit 221 sums the sampling values D<N:0> to obtain a full-period sampling value S' and a semi-period sampling value O'. It should be noticed that the user determines to sum a part of or all of the sampling values D<N:0> according to the actual design requirement. In the present embodiment, assuming the semi-period of the first clock signal HCK1 has 8 sampling phases, so that the computing unit 221 sums the front 8 sampling values D<0>~D<7> (i.e. D<7:0>) to obtain the semi-period sampling value O', and sums all of the 19 sampling values D<0>~D<18> (i.e. D<18:0>) to obtain the full-period sampling value S'. Wherein, 3 samplings are additionally maintained to avoid occurrence of unrecognised samplings during calibration.

The complement unit 222 adjusts the semi-period sampling value O' according to the first sampling value D<0> in the sampling values D<N:0>, so as to output the conversion value OUT1 to the latch unit 120. The complement unit 222 also adjusts the full-period sampling value S' according to the first sampling value D<0> in the sampling values D<N:0>, so as to output the sampling summation $S_{sample}$ to the calibration unit 440. The calibration unit 440 compares the sampling summation $S_{sample}$ to the reference value "8", and adjusts the control signal $C_D$ according to a comparison result, so as to control the time distance of the sampling phases CKD<N:0> output by the delay unit 210.

It should be noticed that the computing unit 221 further performs XOR operations to the sampling values D<N:0> to obtain a plurality of exclusive values X<N:0>, as that shown in FIG. 3. The exclusive values X<N:0> can present a transition status of the first clock signal HCK1. The computing unit 221 sums the exclusive values X<N:0>, and outputs an exclusive summation $S_{XOR}$ to the calibration unit 440. The calibration unit 440 can obtain transition times of the first clock signal HCK1 within a sampling range of the sampling phases CKD<N:0> according to the exclusive summation $S_{XOR}$. Whether the computing unit 221 provides the exclusive summation $S_{XOR}$, and whether the calibration unit 440 processes the exclusive summation $S_{XOR}$ are all determined according to the actual design requirement. In some embodiment, the exclusive summation $S_{XOR}$ can be neglected.

Figure 6:
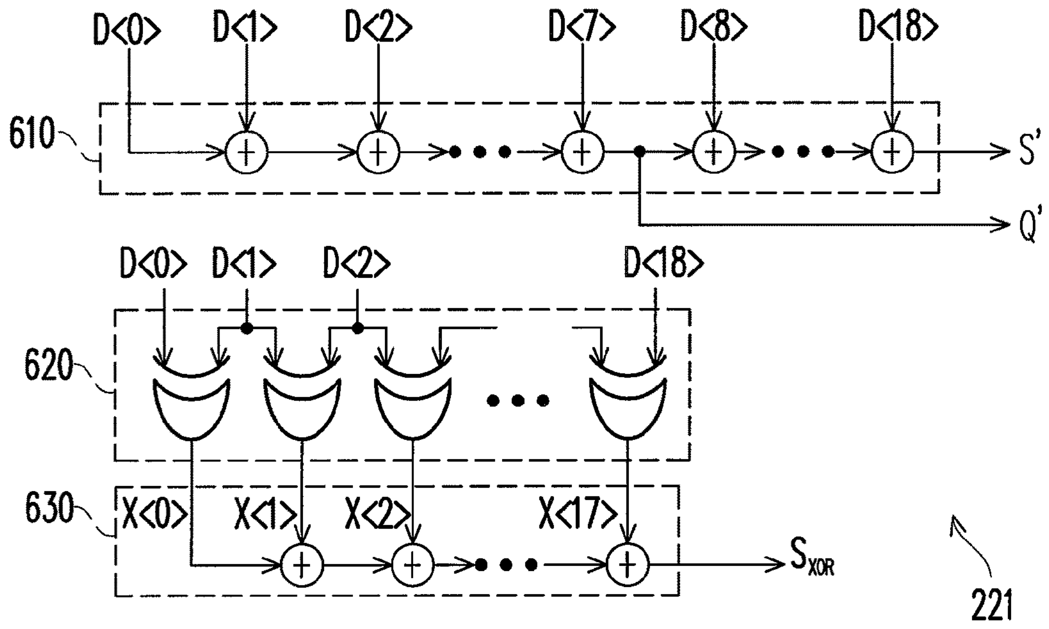
FIG. 6 is a circuit schematic diagram illustrating a computing unit of FIG. 4 according to an embodiment of the present disclosure.

FIG. 6 is a circuit schematic diagram illustrating the computing unit 221 of FIG. 4 according to an embodiment of the present disclosure. Assuming the semi-period of the first clock signal HCK1 has 8 sampling phases according to the design requirement. The computing unit 221 includes 18 first adders 610, 18 XOR gates 620 and 17 second adders 630. The first adders 610 are connected in series for summing the sampling values D<0>~D<18>. A seventh adder and an eighteenth adder in the first adders 610 respectively output the semi-period sampling value O' and the full-period sampling value S'. Two input terminals of each of the XOR gates 620 respectively receive corresponding two sampling values of the sampling values D<0>~D<18>. For example, a first XOR gate receives the sampling values D<0> and D<1>, a second XOR gate receives the sampling values D<1> and D<2>, and the others are deduced by analogy. The output terminals of the XOR gates 620 provide the exclusive values X<N:0> (i.e. X<17:0>). The second adders 630 are connected in series for summing the exclusive values X<N:0> output by the XOR gates 620, so as to obtain the exclusive summation $S_{XOR}$.

Figure 7:
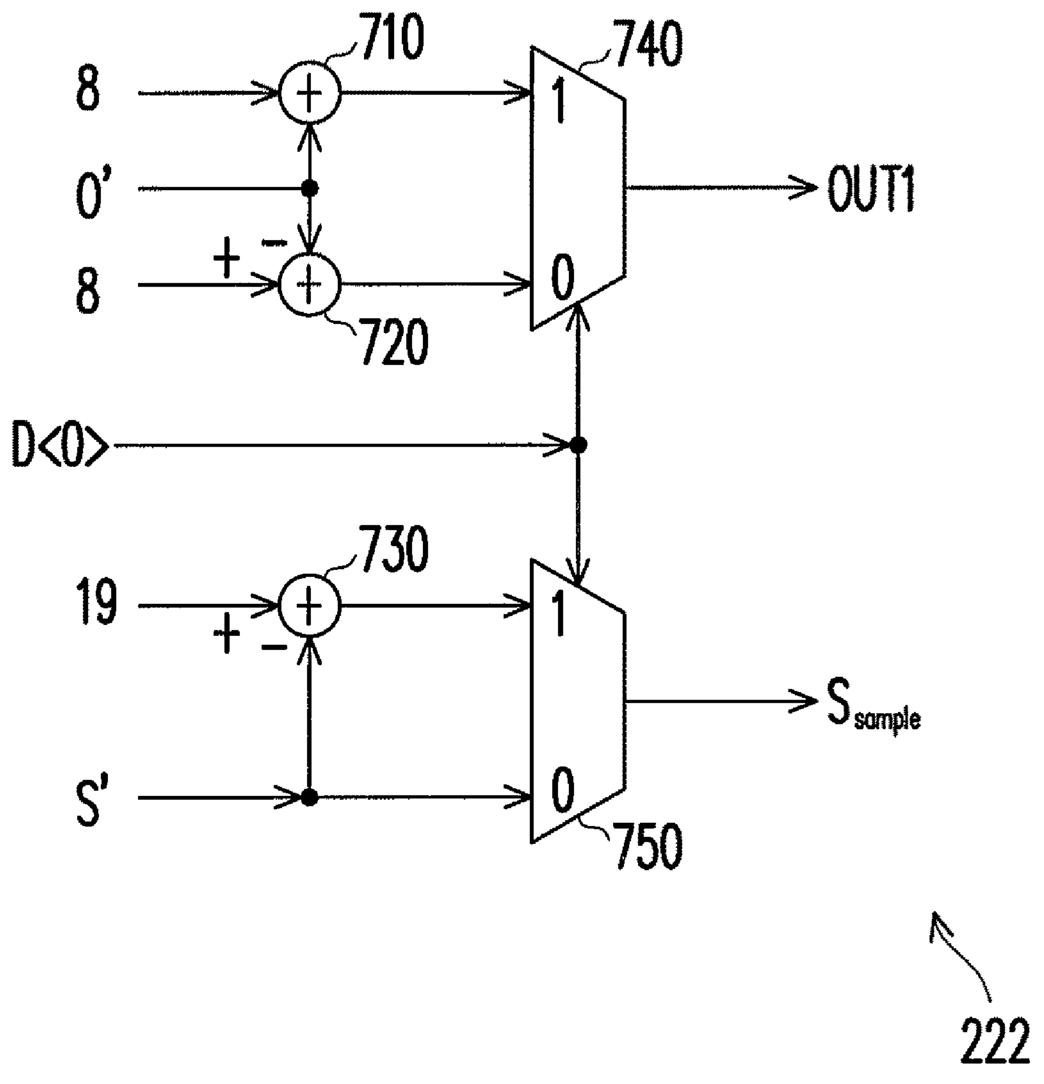
FIG. 7 is a circuit schematic diagram illustrating a complement unit of FIG. 4 according to an embodiment of the present disclosure.

FIG. 7 is a circuit schematic diagram illustrating the complement unit 222 of FIG. 4 according to an embodiment of the present disclosure. The complement unit 222 includes an adder 710, a first subtracter 720, a second subtracter 730, a first multiplexer 740 and a second multiplexer 750. The adder 710 adds the semi-period sampling value O' and a first reference value. In the present embodiment, the first reference value is set to 8, so that the adder 710 outputs 8+O'. The first subtracter 720 subtracts the semi-period sampling value O' from the first reference value, i.e. 8−O'. A control terminal of the multiplexer 740 receives the sampling value D<0>. If the sampling value D<0> is 1, it represents that the first clock signal HCK1 has a full trough between the trigger edges of the first reference signal REF 1 and the first clock signal HCK1. Namely, there are 8 sampling values of 0 in the sampling range of the sampling phases CKD<18:0>, as that shown in FIG. 3. Therefore, if the sampling value D<0> is 1, the multiplexer 740 selects the output value (i.e. 8+O') of the adder 710 as the conversion value OUT1, and transmits the conversion value OUT1 to the latch unit 120. Namely, according to FIG. 3, the semi-period sampling value O' of the sampling values D<0>~D<7> only presents a number of the sampling phases CKD<6:0>, so that a number of the sampling phases CKD<14:7> is required to be added to obtain the number of the sampling phases between the trigger edges of the first reference signal REF1 and the first clock signal HCK1.

Figure 8:
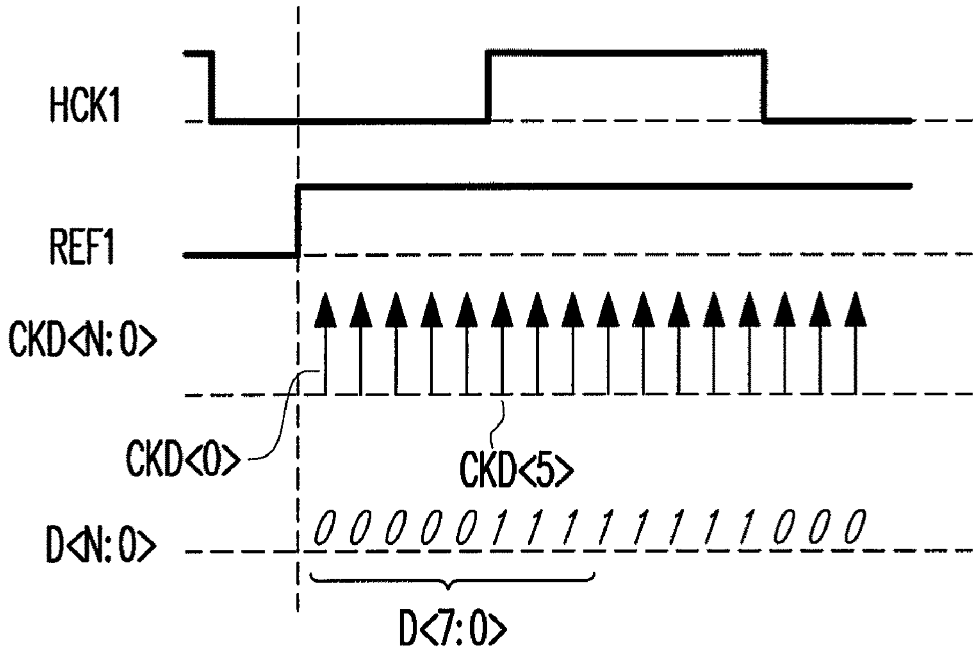
FIG. 8 is a timing diagram illustrating a situation that a time distance (a phase difference) between a first reference signal REF1 and a first clock signal HCK1 is less than a semi-period.

Conversely, if the sampling value D<0> is 0, it represents that the first clock signal HCK1 has an incomplete trough between the trigger edges of the first reference signal REF1 and the first clock signal HCK1. FIG. 8 is a timing diagram illustrating a situation that a time distance (a phase difference) between the first reference signal REF1 and the first clock signal HCK1 is less than the semi-period. According to FIG. 8, the semi-period sampling value O' obtained by summing the sampling values D<7:0> is 3, so that the multiplexer 740 selects an output value (i.e. 8−O') of the first subtracter 720 as the conversion value OUT1, and transmits the conversion value OUT1 to the latch unit 120. Namely, according to FIG. 8, if the sampling value D<0> is 0, the semi-period sampling value O' only presents a number of the sampling phases CKD<7:5> out of a range between the trigger edges of the first reference signal REF1 and the first clock signal HCK1, so that a complement (i.e. 8−O') of the semi-period sampling value O' is required to be calculated to obtain the number of the sampling phases between the trigger edges of the first reference signal REF1 and the first clock signal HCK1.

Referring to FIG. 7, the second subtracter 730 subtracts the full-period sampling value S' from a third reference value. In the present disclosure, the third reference value is set to 19, so that the second subtracter 730 outputs 19-S'. A control terminal of the multiplexer 750 receives the sampling value D<0>. If the sampling value D<0> is 1, the multiplexer 750 selects the output value (i.e. 19-S') of the second subtracter 730 as the sampling summation $S_{sample}$, and transmits the sampling summation $S_{sample}$ to the calibration unit 440. Referring to FIG. 3, the full-period sampling value S' obtained by summing the sampling values D<0>~D<18> only presents a number of the sampling phases of an incomplete semi-period (i.e. the sampling phases CKD<6:0>) and a number of the sampling phases of another incomplete semi-period (i.e. the sampling phases CKD<18:15>), so that a complement (i.e. 19-S') of the full-period sampling value S' is required to be calculated to obtain the number of the sampling phases of a complete semi-period.

If the sampling value D<0> is 0, the multiplexer 750 selects the full-period sampling value S' as the sampling summation $S_{sample}$, and transmits the sampling summation $S_{sample}$ to the calibration unit 440. Referring to FIG. 8, the full-period sampling value S' obtained by summing the sampling values D<0>~D<18> already presents the number of the sampling phases of a complete semi-period, so that the full-period sampling value S' is unnecessary to be processed, and is directly output to the calibration unit 440.

Figure 9:
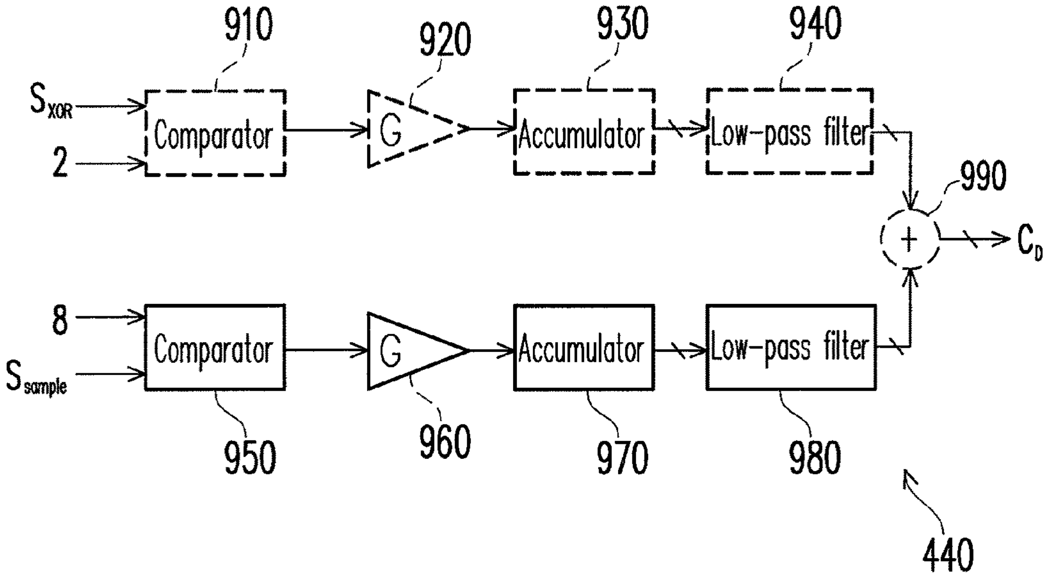
FIG. 9 is a circuit schematic diagram illustrating a calibration unit of FIG. 4 according to an embodiment of the present disclosure.

FIG. 9 is a circuit schematic diagram illustrating the calibration unit 440 of FIG. 4 according to an embodiment of the present disclosure. The calibration unit 440 includes a comparator 910, a comparator 950, a gain amplifier 920, a gain amplifier 960, an accumulator 930, an accumulator 970, a low-pass filter 940, a low-pass filter 980 and an adder 990. The low-pass filter 940 has a wide frequency band, and the low-pass filter 980 has a narrow frequency band. The comparator 950 compares the first reference value with the sampling summation $S_{sample}$. In the present disclosure, the first reference value is set to 8. If the sampling summation $S_{sample}$ is greater than 8, the comparator 950 output "1" to the gain amplifier 960. If the sampling summation $S_{sample}$ is equal to 8, the comparator 950 output "0" to the gain amplifier 960. If the sampling summation $S_{sample}$ is less than 8, the comparator 950 output "−1" to the gain amplifier 960. The gain amplifier 960 performs gain adjustment to the output of the comparator 950, and outputs a result thereof to the accumulator 970. A gain value G of the gain amplifier 960 is determined according to a stable demand of the calibration system. The accumulator 970 accumulates comparison results of the comparator 950, and transmits an accumulated result to the adder 990 through the low-pass filter 980.

The comparator 910 compares the second reference value with the exclusive summation $S_{XOR}$. In the present disclosure, the second reference value is set to 2. If the exclusive summation $S_{XOR}$ is greater than 2, the comparator 910 output "−1" to the gain amplifier 920. If the exclusive summation $S_{XOR}$ is equal to 2, the comparator 910 output "0" to the gain amplifier 920. If the exclusive summation $S_{XOR}$ is less than 2, the comparator 910 output "1" to the gain amplifier 920. The gain amplifier 920 performs gain adjustment to the comparison result of the comparator 910, and outputs a result thereof to the accumulator 930. A gain value G of the gain amplifier 920 is determined according to a stable demand of the calibration system. The accumulator 930 accumulates the comparison results of the comparator 910, and transmits an accumulated result to the adder 990 through the low-pass filter 940. The adder 990 provides the control signal $C_D$ according to the comparison result of the comparator 910 and the comparison result of the comparator 950, so as to adjust the delay time of the controllable delay elements in the delay unit 210.

The exclusive summation $S_{XOR}$ represents a number of the semi-periods experienced by the first clock signal HCK1 during the sampling period. For example, if the exclusive summation $S_{XOR}$ is 2, it represents the first clock signal HCK1 has a complete semi-period during the sampling period. The sampling summation $S_{sample}$ represents the sampling times of the first clock signal HCK1 in the complete semi-period during the sampling period. If the summation $S_{XOR}$ and the sampling summation $S_{sample} \geqq 8$, a convergent stability can be achieved. The comparator 910, the gain amplifier 920, the accumulator 930, the low-pass filter 940 and the adder 990 can also be omitted according to the design requirement. For example, in the calibration unit of the second stage TDC cell 110-2, the comparator 910, the gain amplifier 920, the accumulator 930, the low-pass filter 940 and the adder 990 can also be omitted.

Figure 10:
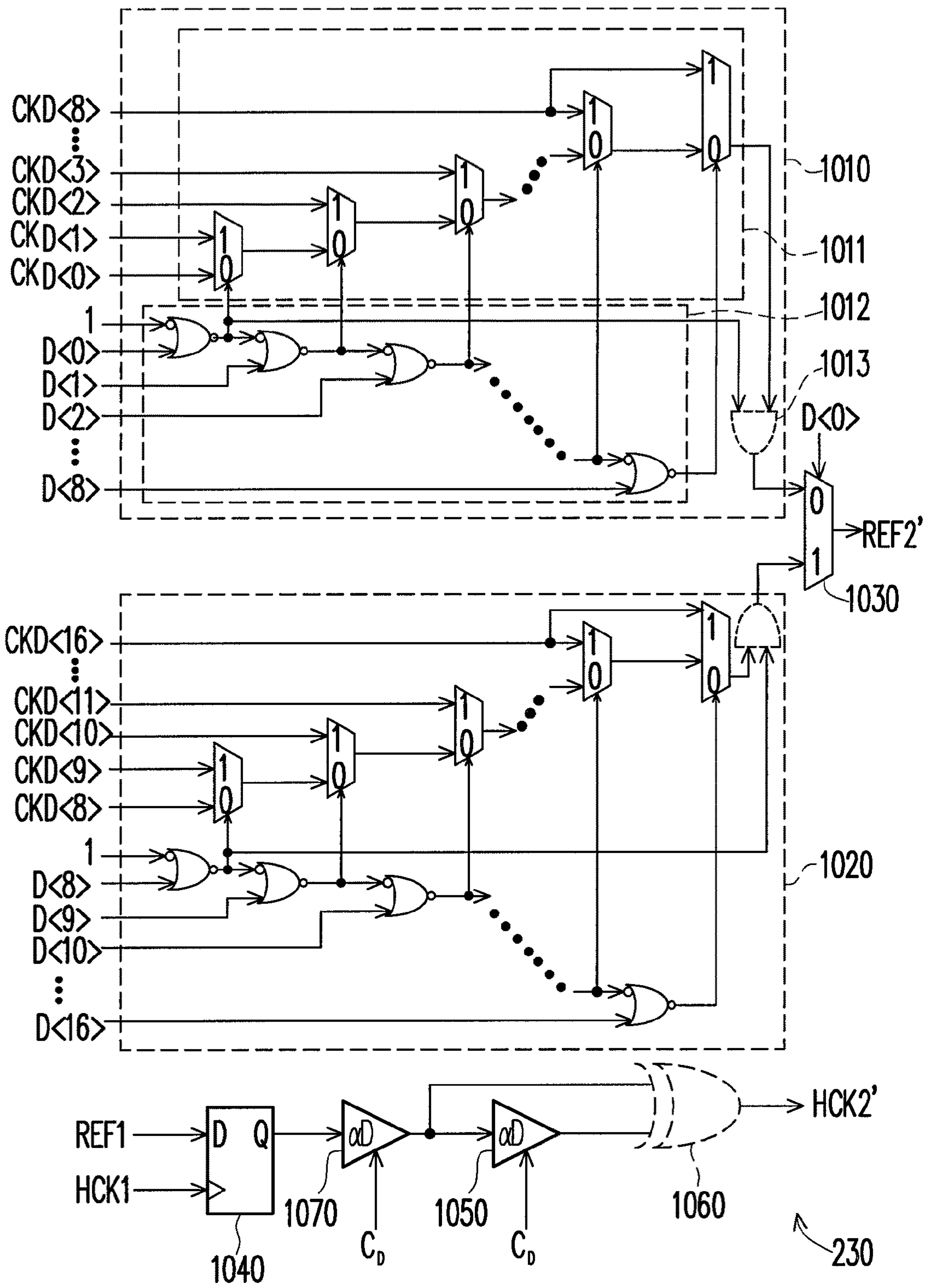
FIG. 10 is a circuit schematic diagram illustrating a determination unit of FIG. 4 according to an embodiment of the present disclosure.

FIG. 10 is a circuit schematic diagram illustrating the determination unit 230 of FIG. 4 according to an embodiment of the present disclosure. The determination unit 230 includes a first semi-period determination circuit 1010, a second semi-period determination circuit 1020 and a third multiplexer 1030. The first semi-period determination circuit 1010 inspects the sampling values D<N:0> of the front semi-period, and selects and outputs one of the sampling phases CKD<N:0> corresponding to the front semi-period according to an inspection result. For example, the first semi-period determination circuit 1010 inspects the sampling values D<0>~D<8>, and selects and outputs one of the sampling phases CKD<0>~CKD<8> according to the inspection result.

The second semi-period determination circuit 1020 inspects the sampling values D<N:0> of the latter semi-period, and selects and outputs one of the sampling phases CKD<N:0> corresponding to the latter semi-period according to an inspection result. For example, the second semi-period determination circuit 1020 inspects the sampling values D<8>~D<16>, and selects and outputs one of the sampling phases CKD<8>~CKD<16> according to the inspection result.

Two input terminals of the multiplexer 1030 are respectively coupled to an output terminal of the first semi-period determination circuit 1010 and an output terminal of the second semi-period determination circuit 1020, and a control terminal of the multiplexer 1030 receives the sampling value D<0>. If the sampling value D<0> is 1, as shown in FIG. 3, it represents that the time residue is appeared in the latter semi-period of the sampling period, for example, appeared in the sampling phases CKD<8>~CKD<16>. Therefore, the multiplexer 1030 selects the output of the second semi-period determination circuit 1020 to serve as the second reference signal REF2', and transmits it to the TDC cell 110-2. If the sampling value D<0> is 0, as shown in FIG. 8, it represents that the time residue is appeared in the front semi-period of the sampling period, for example, appeared in the sampling phases CKD<0>~CKD<8>.

Therefore, when the sampling value D<0> is 0, the multiplexer 1030 selects the output of the first semi-period determination circuit 1010 to serve as the second reference signal REF2', and transmits it to the TDC cell 110-2.

Selection and generation of the second reference signal REF2' and the second clock signal HCK2' shown in FIG. 3 are ideal. Since the sampling values D<N:0> are generated according to the sampling phases CKD<N:0>, an i-th sampling value D<i> surely falls behind an i-th sampling phase CKD<i>. Namely, in practice, when the determination unit 230 detects that i-th sampling value D<i> is 0, and an (i+1)-th sampling value D<i+1> is 1, the determination unit 230 of FIG. 10 is hard to opportunely output the sampling phase CKD<i> ahead of the sampling value D<i> to serve as the second reference signal REF2'. Therefore, the output signals REF2' and HCK2' of FIG. 10 are equivalent to a result that the signals REF2' and HCK2' of FIG. 3 are respectively delayed for the same time. Since the signals REF2' and HCK2' output by the determination unit 230 of FIG. 10 have the same delay time, the delayed signals REF2' and HCK2' can still transmit the correct time residue to the next stage TDC cell 110-2.

Referring to FIG. 10, implementation of the first semi-period determination circuit 1010 is described below. Implementation of the second semi-period determination circuit 1020 can be the same to that of the first semi-period determination circuit 1010. The first semi-period determination circuit 1010 includes a plurality of NOR gates 1012 and a plurality of multiplexers 1011. The NOR gates 1012 respectively have an inverted input terminal, a non-inverted input terminal and an output terminal, wherein the inverted input terminal of an i-th NOR gate is coupled to the output terminal of an (i−1)-th NOR gate, and the non-inverted input terminal of the i-th NOR gate receives the i-th sampling value D<i>, as that shown in FIG. 10. The multiplexers 1011 respectively have a control terminal, a first input terminal, a second input terminal and an output terminal, wherein the control terminal of an i-th multiplexer is coupled to the output terminal of the i-th NOR gate, the output terminal of the i-th multiplexer is coupled to the second input terminal of an (i+1)-th multiplexer, and the first input terminal of the i-th multiplexer receives an (i+1)-th sampling phase CKD<i+1>, as that shown in FIG. 10. The multiplexers 1011 select and output one of the sampling phases CKD<0>~CKD<8> according to the outputs of the NOR gates 1012.

The sampling value D<i> represents any one of the sampling values D<0>~D<8>, and the sampling value D<i+1> represents a next sampling value of the sampling value D<i>. The NOR gates 1012 can sequentially detect the sampling value D<i>. If the sampling value D<i> is 0, the multiplexer 1011 is ready to output the sampling phase CKD<i+1>. If the sampling value D<i+1> is still 0, the multiplexer 1011 is ready to output the sampling phase CKD<i+2>. Conversely, if the sampling value D<i+1> is 1, the multiplexer 1011 outputs the sampling phase CKD<i+1> to an AND gate 1013. Therefore, the NOR gates 1012 can detect whether the time residue is appeared during the sampling period of the sampling phases CKD<0>~CKD<8>, and can control the multiplexers 1011 to output a corresponding sampling phase.

A first input terminal of the AND gate 1013 is coupled to the output terminal of a last multiplexer in the multiplexers 1011, and a second input terminal of the AND gate 1013 is coupled to the output terminal of the first NOR gate in the NOR gates 1012. An output terminal of the AND gate 1013 is coupled to the first input terminal of the multiplexer 1030. Since a design of the NOR gate 1012 is to sequentially detect that the sampling value D<i> is changed from "0" to "1", adding of the AND gate 1013 can expel a situation that the sampling value D<i> is changed from "1" to "0", so as to ensure a correctness of the second reference signal REF2'. In the other embodiments, design of the first semi-period determination circuit 1010 can be changed according to different detecting approaches, and those with ordinary skill in the art should understand that implementation of the first semi-period determination circuit 1010 is not limited to that shown in FIG. 10. Moreover, the AND gate 1013 can also be omitted, so that the output terminal of the last multiplexer of the multiplexers 1011 can be directly coupled to the first input terminal of the multiplexer 1030.

Ideally, the determination unit 230 of the TDC cell 110-1 takes the rising edge of the first clock signal HCK1 appeared behind the rising edge of the first reference signal REF1 as a reference point to select a sampling phase from the sampling phases CKD<N:0> to serve as the second reference signal REF2', wherein the selected sampling phase is closest to the rising edge of the first clock signal HCK1 and located prior to the rising edge of the first clock signal HCK1. According to FIG. 3, ideally, the determination unit 230 should select the sampling phase CKD<14> located prior to the rising edge of the first clock signal HCK1 from the sampling phases CKD<N:0> to serve as the second reference signal REF2'. However, the determination unit 230 of FIG. 10 actually selects the sampling phase CKD<15> located behind the rising edge of the first clock signal HCK1 to serve as the second reference signal REF2'. Namely, compared to the ideal second reference signal REF2', the second reference signal REF2' output by the determination unit 230 of FIG. 10 has the delay time $\alpha D$. The determination unit 230 provides such second reference signal REF2' to the next stage TDC cell 110-2 to serve as a reference clock.

The determination unit 230 further includes a flip-flop 1040, a controllable delay element 1070, a controllable delay element 1050 and an XOR gate 1060. An input terminal of the flip-flop 1040 receives the first reference signal REF1, and a trigger terminal thereof receives the first clock signal HCK1. An input terminal of the controllable delay element 1070 is coupled to an output terminal of the flip-flop 1040, and an input terminal of the controllable delay element 1050 is coupled to an output terminal of the controllable delay element 1070. Wherein, the controllable delay elements 1050 and 1070 respectively determine its own delay time $\alpha D$ according to the control signal $C_D$ output by the calibration unit 440. A first input terminal of the XOR gate 1060 is coupled to the output terminal of the flip-flop 1040, a second input terminal of the XOR gate 1060 is coupled to an output terminal of the controllable delay element 1050, and an output terminal of the XOR gate 1060 provides the second clock signal HCK2'. Ideally, the determination unit 230 outputs the second clock signal HCK2' as that shown in FIG. 3. However, compared to the ideal clock signal HCK2', the determination unit 230 of FIG. 10 can output the second clock signal HCK2' having the delay time $\alpha D$ through the controllable delay element 1070.

The determination unit 230 generates a pulse according to the rising edge of the clock signal HCK1 to serve as the second clock signal HCK2', and provides the second clock signal HCK2' to the next stage TDC cell 110-2 to serve as a high-speed clock. Compared to the ideal clock signal HCK2' and reference signal REF2' shown in FIG. 3, since the signals REF2' and HCK2' output by the determination unit 230 of FIG. 10 have the same delay time $\alpha D$, the delayed signals REF2' and HCK2' can still transmit the correct time residue to the next stage TDC cell 110-2.

Moreover, assuming a minimum delay time αD of the controllable delay element of the delay unit in the TDC cell 110-2 is 20 ps, if a pulse width of the signal HCK2' generated by the determination unit 230 is greater than 8×20 ps, the signals HCK2' and REF2' can be directly provided to the TDC cell 110-2 without using the time amplifier TA1. If the pulse width of the signal HCK2' is not enough, it can be first amplified by the time amplifier TA1 and then provided to the TDC cell 110-2. Now, the signals HCK2' and REF2' are simultaneously possessed by the time amplifier TA1, since the TDC cell 110-2 has a calibration unit, the time amplifier TA1 is only required to have a enough gain to maintain a normal operation of the calibration unit without requiring an accurate gain.

It should be noticed that if the time amplifier TA1 is positive edge-triggered, the XOR gate 1060 of FIG. 10 can be removed, so that the output terminal of the multiplexer 1030, the output terminal of the flip-flop 1040, and the output terminal of the controllable delay element 1050 can be directly coupled to the time amplifier TA1. The XOR gate 1060 can be moved behind the TA1, i.e. the outputs of the flip-flop 1040 and the controllable delay element 1050 are first amplified by the time amplifier TA1, and then the XOR gate 1060 combines the two outputs to form one pulse.

In summary, the present disclosure has at least the following advantages

1. The calibration is performed to the delay circuit, so that a complicated calibration of the time amplifier is avoided.
2. The time amplifier is suitably used to avoid using an extra oscillator to achieve the high resolution.
3. The Vernier structure is divided to avoid using a huge correction circuit.
4. A frequency of the high-speed pulse HCK1 can be reduced, and the high resolution can also be achieved.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A pipeline time-to-digital converter (TDC), comprising:
- a plurality of TDC cells, connected in series, and each of the TDC cells comprising:
  - a delay unit, receiving a first clock signal and a first reference signal output from a previous stage TDC cell, generating a plurality of sampling phases in a period between a trigger edge of the first reference signal and a trigger edge of the first clock signal, and sampling the first clock signal to obtain a plurality of sampling values according to the sampling phases;
  - an output unit, coupled to the delay unit, for receiving the sampling values, and calculating the sampling values to output a conversion value; and
  - a determination unit, coupled to the delay unit, for receiving the sampling values and the sampling phases, selecting a sampling phase corresponding to the trigger edge of the first clock signal from the sampling phases to serve as a second reference signal, generating a pulse according to the trigger edge of the first clock signal to serve as a second clock signal, and outputting the second reference signal and the second clock signal to a next stage TDC cell.

2. The pipeline TDC as claimed in claim 1, further comprising a latch unit coupled to the TDC cells for latching the conversion values output by the TDC cells, so as to output a digital code.

3. The pipeline TDC as claimed in claim 1, wherein the delay unit comprises:
- a plurality of controllable delay elements, coupled in series, an input terminal of a first one of the controllable delay elements receiving the first clock signal, and output terminals of the controllable delay elements providing the sampling phases, wherein the controllable delay elements respectively determine a delay time according to a control signal; and
- a plurality of samplers, having trigger terminals receiving the first reference signal, input terminals being one-by-one coupled to the output terminals of the controllable delay elements, and output terminals providing the sampling values.

4. The pipeline TDC as claimed in claim 1, wherein the delay unit comprises:
- a plurality of delay buffers, connected in series, and an input terminal of a first one of the delay buffers receiving the first clock signal;
- a plurality of controllable delay elements, coupled in series, an input terminal of a first one of the controllable delay elements receiving the first reference signal, and output terminals of the controllable delay elements providing the sampling phases, wherein the controllable delay elements respectively determine a delay time according to a control signal; and
- a plurality of samplers, having trigger terminals being one-by-one coupled to the output terminals of the controllable delay elements, input terminals being one-by-one coupled to output terminals of the delay buffers, and output terminals providing the sampling values.

5. The pipeline TDC as claimed in claim 1, wherein the delay unit comprises:
- a plurality of controllable delay elements, coupled in series, an input terminal of a first one of the controllable delay elements receiving the first reference signal, and output terminals of the controllable delay elements providing the sampling phases, wherein the controllable delay elements respectively determine a delay time according to a control signal; and
- a plurality of samplers, having trigger terminals being one-by-one coupled to the output terminals of the controllable delay elements, input terminals receiving the first clock signal, and output terminals providing the sampling values.

6. The pipeline TDC as claimed in claim 5, wherein the samplers are flip-flops.

7. The pipeline TDC as claimed in claim 5, wherein the output unit further sums the sampling values to output a sampling summation, and each of the TDC cells further comprises:
- a calibration unit, coupled to the output unit and the delay unit, comparing the sampling summation with a reference value to obtain a comparison result, and providing the control signal according to the comparison result, so as to adjust the delay time of the controllable delay elements.

8. The pipeline TDC as claimed in claim 1, wherein the output unit comprises:
- a computing unit, coupled to the delay unit for receiving the sampling values, and summing the sampling values to obtain a full-period sampling value and a semi-period sampling value; and a complement unit, adjusting the semi-period sampling value according to a first one of the sampling values to output the conversion value, and adjusting the full-period sampling value according to the first one of the sampling values to output a sampling summation.

9. The pipeline TDC as claimed in claim 8, wherein the computing unit comprises:

a plurality of first adders, connected in series, for summing the sampling values, and two of the first adders respectively outputting the semi-period sampling value and the full-period sampling value;

a plurality of XOR gates, respectively having two input terminals receiving corresponding two sampling values of the sampling values; and a plurality of second adders, connected in series, for summing outputs of the XOR gates to obtain an exclusive summation.

10. The pipeline TDC as claimed in claim 9, wherein each of the TDC cells further comprises:

a calibration unit, coupled to the output unit and the delay unit, comparing the sampling summation with a first reference value to obtain a first comparison result, comparing the exclusive summation with a second reference value to obtain a second comparison result, and providing the control signal according to the first comparison result and the second comparison result, so as to adjust the delay time of the controllable delay elements.

11. The pipeline TDC as claimed in claim 8, wherein the complement unit comprises:

an adder, adding the semi-period sampling value and a first reference value;

a first subtracter, subtracting the semi-period sampling value from the first reference value;

a first multiplexer, having a control terminal receiving a first one of the sampling values, a first input terminal coupled to an output terminal of the adder, a second input terminal coupled to an output terminal of the first subtracter, and an output terminal providing the conversion value;

a second subtracter, subtracting the full-period sampling value from a third reference value; and a second multiplexer, having a control terminal receiving the first one of the sampling values, a first input terminal coupled to an output terminal of the second subtracter, a second input terminal receiving the full-period sampling value, and an output terminal providing the sampling summation.

12. The pipeline TDC as claimed in claim 1, wherein the determination unit comprises:

a first semi-period determination circuit, inspecting the sampling values of the front semi-period, and selecting and outputting one of the sampling phases corresponding to the front semi-period according to an inspection result;

a second semi-period determination circuit, inspecting the sampling values of the latter semi-period, and selecting and outputting one of the sampling phases corresponding to the latter semi-period according to an inspection result;

a third multiplexer, having two input terminals respectively coupled to an output terminal of the first semi-period determination circuit and an output terminal of the second semi-period determination circuit, a control terminal receiving a first one of the sampling values, and an output terminal providing the second reference signal;

a flip-flop, having an input terminal receiving the first reference signal, and a trigger terminal receiving the first clock signal;

a first controllable delay element, having an input terminal coupled to an output terminal of the flip-flop; and a second controllable delay element, having an input terminal coupled to an output terminal of the first controllable delay element, wherein the first controllable delay element and the second controllable delay element respectively determine a delay time according to a control signal.

13. The pipeline TDC as claimed in claim 12, wherein the determination unit further comprises:

an XOR gate, having a first input terminal coupled to the output terminal of the first controllable delay element, a second input terminal coupled to the output terminal of the second controllable delay element, and an output terminal providing the second clock signal.

14. The pipeline TDC as claimed in claim 12, wherein the first semi-period determination circuit comprises:

a plurality of NOR gates, respectively having an inverted input terminal, a non-inverted input terminal and an output terminal, wherein the inverted input terminal of an i-th NOR gate is coupled to the output terminal of an (i−1)-th NOR gate, and the non-inverted input terminal of the i-th NOR gate receives an i-th sampling value; and a plurality of multiplexers, respectively having a control terminal, a first input terminal, a second input terminal and an output terminal, wherein the control terminal of an i-th multiplexer is coupled to the output terminal of the i-th NOR gate, the output terminal of the i-th multiplexer is coupled to the second input terminal of an (i+1)-th multiplexer, and the first input terminal of the i-th multiplexer receives an (i+1)-th sampling phase.

15. The pipeline TDC as claimed in claim 1, further comprising at least one time amplifier coupled between two adjacent TDC cells.

* * * * *